United States Patent
Metala et al.

(10) Patent No.: US 8,941,970 B2
(45) Date of Patent: Jan. 27, 2015

(54) METHOD AND APPARATUS FOR DEMAGNETIZING GENERATOR COMPONENTS PRIOR TO ELECTROMAGNETIC CORE IMPERFECTION TESTING OR EL-CID TESTING

(75) Inventors: Michael J. Metala, Murrysville, PA (US); Werner Yzelman, Murrysville, PA (US)

(73) Assignee: Siemens Energy, Inc., Orlando, FL (US)

( * ) Notice: Subject to any disclaimer, the term of this patent is extended or adjusted under 35 U.S.C. 154(b) by 423 days.

(21) Appl. No.: 13/275,425

(22) Filed: Oct. 18, 2011

(65) Prior Publication Data

US 2013/0094117 A1   Apr. 18, 2013

(51) Int. Cl.
*H01F 13/00* (2006.01)
*H02K 15/02* (2006.01)
*G01R 31/34* (2006.01)

(52) U.S. Cl.
CPC .............. *H01F 13/006* (2013.01); *H02K 15/02* (2013.01); *G01R 31/34* (2013.01)
USPC ........................................................ 361/267

(58) Field of Classification Search
USPC ........................................................ 361/267
See application file for complete search history.

(56) References Cited

U.S. PATENT DOCUMENTS

| | | | | |
|---|---|---|---|---|
| 3,164,753 A * | 1/1965 | Schroeder | | 361/145 |
| 3,979,821 A * | 9/1976 | Noodleman | | 29/598 |
| 4,007,387 A * | 2/1977 | Rustecki | | 310/181 |
| 4,360,854 A * | 11/1982 | Schergen et al. | | 361/149 |
| 4,402,032 A | 8/1983 | Wilterdink | | |
| 4,423,343 A * | 12/1983 | Field, II | | 310/49.34 |
| 4,486,678 A * | 12/1984 | Olson | | 310/156.28 |
| 4,488,962 A * | 12/1984 | Inoue | | 210/138 |
| 4,508,998 A * | 4/1985 | Hahn | | 318/400.41 |
| 4,887,184 A * | 12/1989 | Armond | | 361/149 |
| 5,321,362 A | 6/1994 | Fischer | | |
| 5,404,063 A * | 4/1995 | Mills | | 310/266 |
| 5,502,368 A * | 3/1996 | Syverson et al. | | 322/28 |
| 5,995,358 A * | 11/1999 | Buisson et al. | | 361/267 |
| 6,097,127 A * | 8/2000 | Rivera | | 310/184 |
| 6,160,697 A * | 12/2000 | Edel | | 361/143 |
| 6,479,979 B1 * | 11/2002 | Kingsley et al. | | 324/96 |
| 6,522,517 B1 * | 2/2003 | Edel | | 361/143 |
| 6,876,222 B2 | 4/2005 | Fischer | | |
| 7,113,384 B2 * | 9/2006 | Swinbanks et al. | | 361/143 |
| 7,262,536 B2 * | 8/2007 | Rahman et al. | | 310/156.35 |
| 7,451,719 B1 * | 11/2008 | Fitzpatrick et al. | | 114/240 R |
| 7,531,933 B2 * | 5/2009 | Miyata et al. | | 310/156.38 |
| 7,768,165 B2 * | 8/2010 | Scott et al. | | 310/71 |
| 2004/0000923 A1 * | 1/2004 | Fischer et al. | | 324/772 |
| 2004/0027022 A1 * | 2/2004 | Weir | | 310/178 |

(Continued)

FOREIGN PATENT DOCUMENTS

EP   1895636 A2   3/2008
WO   8202803 A1   8/1982

*Primary Examiner* — Rexford Barnie
*Assistant Examiner* — Angela Brooks

(57) ABSTRACT

A method and apparatus for determining and for reducing magnetism in a generator stator core (20). The method includes extending one or more conductors (38) proximate the core, applying a polarity-reversing excitation voltage to the one or more conductors, and reducing an amplitude of the voltage over time, wherein the voltage causes current to flow in the conductors, the current generating a magnetic field that demagnetizes the core. The method and apparatus are useful for determining hot spots in the core.

21 Claims, 1 Drawing Sheet

(56) References Cited

U.S. PATENT DOCUMENTS

| | | |
|---|---|---|
| 2004/0042150 A1 | 3/2004 | Swinbanks et al. |
| 2004/0080229 A1* | 4/2004 | Haner ............................ 310/166 |
| 2005/0151438 A1* | 7/2005 | Huang et al. ................... 310/180 |
| 2006/0138646 A1* | 6/2006 | Aisenbrey ...................... 257/712 |
| 2007/0278890 A1 | 12/2007 | Huang et al. |
| 2009/0224627 A1* | 9/2009 | Hino et al. ............. 310/216.077 |
| 2009/0236923 A1* | 9/2009 | Sakai et al. ............... 310/156.43 |
| 2010/0060223 A1* | 3/2010 | Sakai et al. .................... 318/494 |
| 2010/0123426 A1* | 5/2010 | Nashiki et al. ................. 318/701 |
| 2012/0091848 A1* | 4/2012 | Sakai et al. ............... 310/156.43 |

* cited by examiner

METHOD AND APPARATUS FOR DEMAGNETIZING GENERATOR COMPONENTS PRIOR TO ELECTROMAGNETIC CORE IMPERFECTION TESTING OR EL-CID TESTING

FIELD OF THE INVENTION

The presented embodiments relate generally to methods and apparatuses for identifying generator core shorts and other core imperfections and, more particularly, to methods and apparatuses for demagnetizing the generator core prior to testing for such shorts and other imperfections.

BACKGROUND OF THE INVENTION

An electric generator transforms rotational energy into electrical energy according to generator-action principles of a dynamoelectric machine. Turning torque is supplied to a rotating and magnetized rotor by a combustion or steam-driven turbine and converted to alternating current (AC) electricity, typically three-phase AC, in a stationary shell-like cylindrical stator. Rotation of the rotor within an axial bore of the stator generates AC electricity within stator windings supported by a stator core.

The generator is a mechanically massive and electrically complex structure, supplying output power up to 2,222 MVA at voltages up to 27 kilovolts. A large generator, for example a 500 megawatt generator, weighs about 200 tons, is approximately 6 meters long and 2.6 meters in diameter, with a bore diameter of about 1.3 meters and an air gap (i.e., between the rotor and stator) of about 0.75 to about 2.0 inches. Electrical generators are the primary power producers in an electrical power system.

The stator core comprises thousands of thin high-permeability (e.g., steel) circumferentially-slotted laminations (about 200,000 laminations in one embodiment) that are horizontally stacked and clamped together. Each lamination defines a central opening and thus when stacked the plurality of openings define the axial bore that extends an axial length of the core. The plurality of laminations defines the stator core. Each lamination is about 0.3 mm thick and coated with an insulating material, for example a varnish, to electrically insulate each lamination from adjacent laminations that it contacts and thereby reduce eddy current losses. The core laminations are held together by bars or rods that are distributed around a circumference of the core and extend axially through each lamination.

Each lamination (and thus the stator core) further comprises a plurality of inwardly facing (i.e., toward a centerline of the core) teeth. Stator windings, typically comprising electrically insulated copper bars, are disposed within parallel slots that are defined between consecutive teeth. The copper bars extend axially along a length of the core. The generator output current is generated within these copper bars.

The rotor is rotatably driven by a rotating turbine and carries an axial field winding (also referred to as a rotor winding) energized by direct current supplied from an exciter. As the constant (with respect to time) magnetic flux produced by the rotor winding rotates within the stator core, it cuts the stator windings and generates alternating current within these windings. The steel laminations ensure that the stator core presents a path of low magnetic impedance to the magnetic flux of the spinning rotor.

The rotor and stator are enclosed within a frame. Each rotor end comprises a bearing journal cooperating with bearings attached to the frame to provide a low-friction interface between the rotor and the frame.

The AC electricity induced in the stator windings by action of the rotor's rotating magnetic field flows to external terminals on the generator frame for connection to an external electrical load. Three-phase alternating current is produced by a generator that comprises three independent stator windings spaced at 120° around the stator core. Single-phase alternating current is supplied from a single stator winding.

It is vital to prevent the generation of unwanted currents in the stator core (as opposed to the desired currents in the stator windings) that may cause serious core overheating, explosion, or fire if not detected and repaired. The insulation between adjacent laminations is intended to prevent the formation and flow of these currents. However, if insulation between the laminations, especially insulation along a tooth edge proximate the bore opening, is damaged during assembly, operation or maintenance, conducting circuits may be formed. The rotating flux can induce currents within these circuits; the flow of these currents can cause hot spots (regions of high current density that lead to overheating) in the damaged area. If allowed to persist, the high temperature generated in the region surrounding the hot spot can also damage or possibly lead to failure of electrical insulation surrounding the stator conductors, necessitating replacement of these stator conductors. There have been situations where hot spots have grown so large that the entire core had to be rebuilt.

One prior art hot spot detector, referred to as a loop test, excites the core to a magnetic flux density near its operating flux density (e.g., about 85% of the operating flux density) using a temporary high-power ring flux loop. This technique employs a heavy gauge conductor that extends through the stator bore, around the outside of the generator frame, then back through the bore. Three to ten turns of this conductor are normally required. The loop is energized with a high voltage and technicians are positioned within the bore to manually examine the surface of the stator in search of hot spots.

A thermographic inspection technique is an alternative to conducting hands-on observations. This technique also employs the heavy gauge conductor to excite the core to its operational (or near operational) magnetic flux density. The entire surface of the core is then scanned with an infrared detector. The scan process is conducted from one end of the core to the other end, with the detector traversing axially and circumferentially in search of infrared radiation that reveals core hot spots.

The loop test is typically performed on a new or rewound stator core because the rotor must be removed before the test can be performed. The test provides a baseline result for comparing against subsequent loop tests (or other hot spot detecting tests) conducted on that core. These latter tests may reveal potential hot spots. By comparison with the baseline test results, one can determine whether a particular hot spot has recently developed or was present during the baseline test.

More recently, electromagnetic detectors, such as an Electromagnetic Core Imperfection Detector (EL-CID) as described in U.S. Pat. No. 5,321,362, have been employed to identify core hot spots. This technique employs, in one embodiment, an excitation current loop (usually six turns) of No. 10 AWG 300-volt wire installed in the bore of the stator core. The wire is commonly suspended along a bore center line and around the frame in a manner similar to the path of the conductor used in the high-power loop test technique described above.

The conductor loop is connected to a source of constant-frequency amplitude-adjustable AC voltage (a 240-volt variable transformer, for example). A separate single-turn search coil determines when the proper level of core excitation has been achieved. Typically, the voltage is adjusted to produce a flux density of approximately 4% of the operating flux density of the generator core. At this low flux density, technicians can safely enter the bore with a detector pickup coil (i.e., a Chattock coil or sensor) to detect axial currents in the laminations by detecting magnetic fields emanating from those currents as they flow through the shorted laminations. Alternatively, the pickup coil is remotely controlled to move within the bore, in particular in an application when the rotor is in place when the EL-CID test is conducted.

For conducting tests with the rotor in place, the assignee of the present invention has developed a process (referred to commercially as a FAST GEN$^{SM}$ test) in which a robotic carriage carrying the EL-CID sensor is fed into the air gap space between the rotor and the stator. For FAST GEN inspections, the excitation current loop comprises about six or seven turns of flat conductor cable that is also threaded through the air gap.

Whether the EL-CID test is conducted with the rotor in place or removed, the EL-CID pickup coil or sensor is moved over the entire inwardly-facing surface that defines the bore. The sensor is moved in a series of overlapping circumferential patterns to test all coil slots and teeth around the entire 360 degrees circumference and over the entire axial length of the core. The output signal is observed on an output device or plotted. Any areas of elevated axial current in the laminations, whether along the surface of the core that defines the bore or at some distance below that surface, are indicated as peaks in the output signal. The need for corrective action can be determined by analyzing these peaks.

A desired value of the EL-CID excitation voltage is a function of several core and stator parameters, including the stator line-to-line voltage, the number of turns per phase winding, the coil pitch, the number of rotor poles, and the number of stator winding slots. The resulting excitation voltage produces a desired level of magnetic flux that in turn generates a desired voltage in the pick-up coil. This value of flux produces a uniform scalar magnetic potential drop between adjacent teeth of the stator core along the axial length of the core. Hot spots in the core disturb this uniform potential both axially and circumferentially, producing a different potential value that can be detected by the sensor coil.

The output signals from the detector pickup coil can be further processed and analyzed by comparing the output signals to known reference values (e.g., based on earlier scans of the same core, such as a baseline scan) to assist in characterizing any hot spot or flaw that has been identified.

Strong real-time magnetic fields are created during generator operation and during the loop test (which is performed at about 85% of the generator's rated flux); residual magnetic fields are those that remain after the generator has been shutdown or the loop test concluded. The nature and strength of these residual fields are functions of the magnetic properties of the core material, heat treatment of the core material, residual stresses and the manner in which the core was shut down.

In identifying core hot spots (either by conducting a loop test or an EL-CID test) it is desirable to have a hot spot test conducted when the residual magnetism is zero or near zero (e.g., on a new, restacked or rewound core). The results of such a test are referred to a baseline results or flat line results (e.g., minimal or zero residual magnetism, with no noise in the test output caused by residual magnetism). When testing newly-manufactured cores, a "flat line" trace plot is created for each tested coil slot. This plot provides an ideal baseline since the residual magnetism is zero. The baseline can be used later for comparison with all future test results and trend analyses for the generator.

The amount of residual magnetism that remains in the core after core shutdown is neither accurately determinable nor accurately controllable. It is determined from the BH curve (magnetic flux (B) and magnetic field intensity (H) curve) for a specific core and the level of the magnetic field intensity when the generator is shutdown. The amount of residual magnetism remaining after a loop test is also determined from the BH curve for the core.

To understand the cause and effects of the residual magnetism, one can consider the EL-CID excitation loop as a primary transformer coil and the EL-CID sensor as a secondary transformer coil (step down). The stator serves as a transformer core and thus is a primary determinant of transformer efficiency. A demagnetized core (which has a high permeability and a low reluctance since reluctance and permeability are inversely related) is more efficient and homogenized; power is transmitted cleanly (i.e., with little noise) and easily from the primary to the secondary circuit as the magnetic fields pass easily through the stator core. Residual magnetization in the core decreases the core permeability (and therefore increases the reluctance or resistance to the magnetic fields), raises electrical losses in the core and causes fluctuations in the transmission of power between the primary and secondary coils. As a result of this residual magnetism, a small change in the primary coil voltage leads to a large change in the secondary coil voltage. These large voltages mimic signals produced by stator "short circuits," which the EL-CID test is designed to detect. Thus the residual magnetism in the stator (i.e., the transformer core) masks or exacerbates the EL-CID signals by interfering with the transmission of power between the EL-CID exciter and detector.

Unfortunately, the resulting noisy EL-CID test results (whether in numerical or graphical form) require tedious interpretation and trend analysis to remove the effects due to residual magnetism from the true test results. Results of an EL-CID test performed after a loop test typically show a high noise level due to the residual magnetism that remains after the loop test. Results of the El-CID test performed after generator shutdown also show high noise levels again due to the residual magnetism resulting from generator operation. EL-CID tests performed before the loop test typically indicate a much lower noise signal level, but still a level that is problematic.

The amount of residual magnetism is also dependent on the manner in which the generator is shutdown, i.e., a normal shutdown or a forced shutdown. A normal shutdown typically produces minimal residual magnetism. An emergency shutdown or rapid loss of load (i.e., a forced shutdown) may cause significant residual magnetic fields to be present in the stator.

Since new cores have not been in active service nor subjected to a prior loop test, an EL-CID test can be performed on a new core under near-ideal test conditions, i.e., without the effects of residual magnetism. Comparing the EL-CID test results of a new core with results from the core after it has been in service is difficult due to a possible difference in the amount of residual magnetism at the time of each test. The residual magnetism, when present, fouls the test results, making it difficult to accurately compare the results, conduct trend analyses, and identify further deterioration of hot spots by comparison with prior test results.

Not only have prior EL-CID test results displayed a poor signal-to-noise ratio, they have also exhibited a phenomenon referred to as "banding." Banding refers to the movement or oscillation of the EL-CID trace plot above and/or below a zero level during a portion of the overall trace. It appears that this "banding" is due to differences in magnetic permeability along the length of the stator core. The "banding" is exacerbated by the presence of residual magnetic fields in the core.

Demagnetization or degaussing of rotating machinery for preventing electrical discharge damage is known in the art. Demagnetization of machinery components after magnetic particle NDE (nondestructive evaluation) is also common industry practice. However, demagnetization of a generator core prior to conducting hot spot testing has heretofore not been successfully accomplished.

BRIEF DESCRIPTION OF THE DRAWINGS

The invention is explained in the following description in view of the drawings that show.

DETAILED DESCRIPTION OF THE INVENTION

Figure 1:
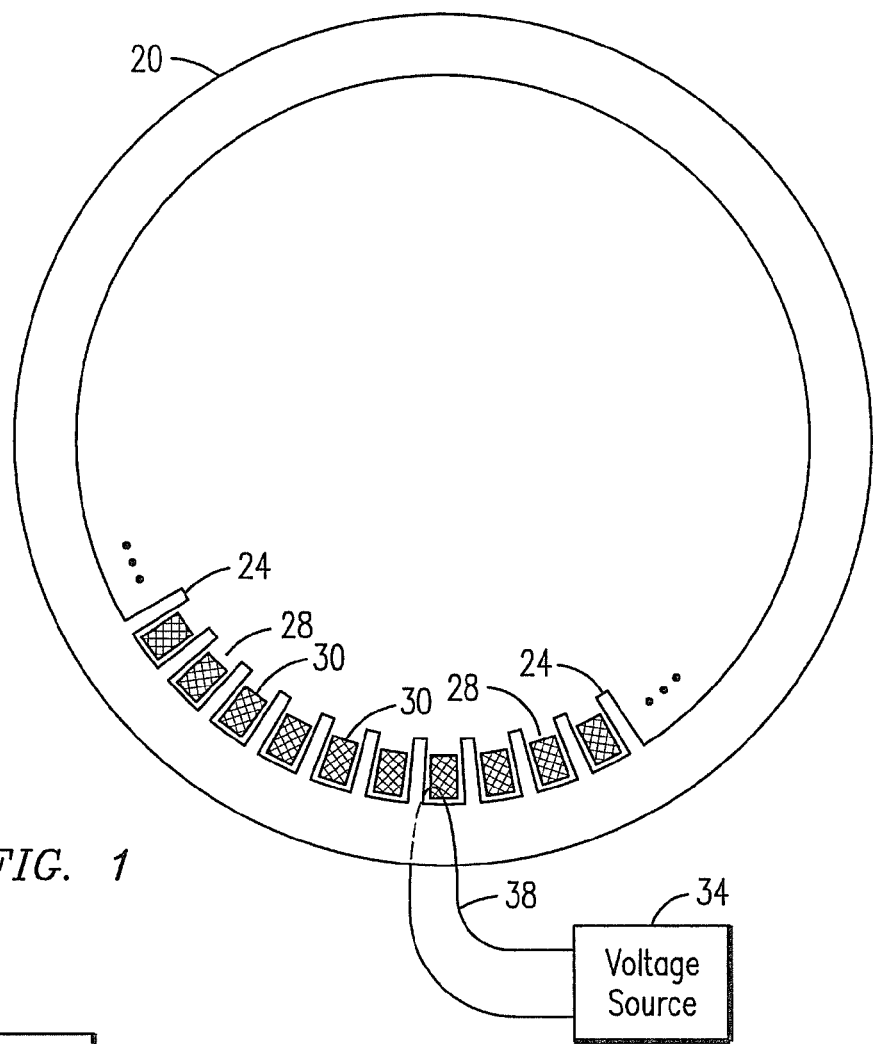
FIG. 1 is a partial top view and partial schematic of an embodiment of the invention for demagnetizing a stator core.

The presented embodiments describe a novel and non-obvious technique that reduces or possibly eliminates residual magnetic fields in the core and the resultant "banding" phenomenon and noise that appear in the EL-CID test results. This residual magnetism may be caused by recent loop hot-spot tests or after shutdown of the generator from active service (especially a forced shutdown). Further, the embodiments describe a novel and non-obvious technique for quantitatively measuring the amount of reduction in the residual magnetic fields using the actual EL-CID excitation current compared with the expected excitation current based on a constant calculated excitation voltage level.

The inventors have identified a link between noisy, banding, EL-CID test results (e.g. a plot of the test results) and the residual magnetism present in the stator core. Various generator size and operational parameters are inserted into an equation, well-known by those skilled in the art, to determine a voltage to be applied to the EL-CID excitation/conductor loop to produce the desired 4% flux level. This voltage produces a current in the excitation/conductor loop, which current value can also be calculated. However, if the actual current in the loop is higher than the calculated value (sometimes three or four amperes above the nominal calculated value), this is typically an indication that residual magnetism remains in the core.

The higher than-expected current and the attendant residual magnetism is evidence of a core having a lower magnetic permeability and a higher reluctance to the magnetic fields. These conditions cause magnetic losses, which require more current to be drawn through the excitation/conductor loop. The additional current causes the generation of more electrical noise. Demagnetizing the core prior to conducting the EL-CID test restores the core to an almost non-magnetized state, leading to less current drawn by the conductor loop and therefore less noise in the resulting EL-CID test signal.

Also, theoretically, a reduction in the residual magnetism in the core, as achieved by the embodiments of the present invention, increases the relative permeability of the core (lowers the reluctance) and therefore requires a lower excitation current to establish the required fields for the EL-CID test. Further, a lower EL-CID excitation current provides a better signal-to-noise ratio in the output signal from the detector and therefore more accurate EL-CID test results.

Conversely, a core exhibiting a high value of residual magnetism requires a higher excitation current. As discussed above, during the EL-CID test, a relatively low current is supplied to the core. But if the core exhibits a high residual magnetism, the magnetic field generated by the supplied current may be overwhelmed, or at least influenced, by the residual magnetic field. Thus it is more difficult to separate the magnetic fields created by the current supplied during the EL-CID test (the current caused by core shorts, which in turn lead to hot spots) from the residual magnetic fields. To overcome this situation, a higher value of excitation current is required during the EL-CID tests.

Ferromagnetic materials contain magnetic domains, i.e., localized regions in which the atomic or molecular magnetic moments are aligned in parallel. In a material that is not magnetized the domains are randomly oriented and the magnetic moments (which are vector quantities) add to zero. When the material is exposed to a magnetic field intensity H, the domains tend to align to the applied field and add to that field.

Generally, the demagnetization process exposes an object to a reversing magnetizing field that gradually diminishes in intensity with time. The field causes a corresponding reversal and reduction in the residual magnetic field intensity by scrambling the magnetic domains in the object. Demagnetization is accomplished by applying a voltage to a conductor disposed in proximate relation to an object to be demagnetized. The voltage causes a current to flow in the conductor and the current produces a magnetic field. By alternating the field polarity and reducing the voltage, which in turn reduces the current, the magnetic field is correspondingly reduced in intensity and reversed in direction. These changes in the magnetic field demagnetize the object.

According to the presented embodiments demagnetization of the core is accomplished with an apparatus that includes a conductor passing through the axial bore of the stator core or through the air gap between the stator and rotor. In one embodiment the conductor comprises two loops of a 4/0 gage (12 mm or 0.45 inches in diameter) multi-strand conductor.

The current supplied from a power supply to the conductor comprises an AC current, or a DC current that reverses polarity about every three to five seconds. Initially a high value of current (e.g., between about 500 and 20,000 A) is supplied to the conductor, with the current reduced over time to decrease the magnetic field intensity (H) and thus progress down the BH hysteresis curve until a zero or near zero value of magnetic flux density (B) is reached.

If AC current is employed, it can be reduced using a variable transformer with a secondary output that is manually or automatically controlled down to about zero. Alternatively, the output current can be reduced using a step-down switch connected to a tapped transformer secondary winding. Certain solid state systems, as known by those skilled in the art, can also be used to damp the output current to about zero. Typically, the AC current begins at a value between about 500 and 2000 A. The output voltage is typically between about 18 and 60 V, which is inconsequential to the demagnetization process, since the current defines the demagnetization power.

If DC current is employed, the device requires a technique for both reducing the DC voltage (linearly, in fixed increments, or in variable increments) and reversing the polarity of the DC voltage. The polarity reversal can be accomplished by alternating pulses of positive and negative polarity, e.g., at about five to ten cycles per second (i.e., a polarity-reversing frequency). Using DC current to demagnetize the core may be preferable. AC current tends to flow near a surface of a conductor; DC current tends to penetrate deeper into the surface, by as much as an inch. Thus the use of DC current provides demagnetization at greater distances into core.

The apparatus for supplying the demagnetization current provides current from zero amperes to a very high maximum current value, with multiple adjustable current values between zero and the maximum value. The maximum current output values may be, for example, 500, 1000, 2000, 4000, 6000, 10,000 and 20,000 amperes. A typical AC magnetization excitation may have a duration of about 0.5 seconds and an AC demagnetization excitation may have a duration of about ten seconds.

Reversing the DC polarity produces deeper (i.e., extending a greater depth into the core) core demagnetization. Automatic systems typically supply a three second pulse, switch the pulse polarity, and reduce current by between about 200-500 amperes. This cycle is followed by another three second pulse, a polarity switch and a further reduction in the current. The process continues until a zero current value is reached. In a manual DC demagnetization system there may not be a specific time duration for each pulse, but the manual system may provide better control of the current of each pulse.

It has been determined that the entire core can be effectively demagnetized by conducting the demagnetization process with the conductor (or a plurality of conductors forming a winding) at only one core location. This is due to the high permeability of the core material. In other applications it may be necessary to carry out the demagnetization process at two or more locations of the core.

FIG. 1 illustrates a stator core 20 comprising stator teeth 24 with grooves 28 defined between successive teeth 24. A stator winding, typically in the form of a conductive bar 30, is disposed within each groove 28. The stator windings are connected together (not shown) at an end region of the core 20.

A voltage source 34 supplies current to a conductor 38 that is disposed within one of the grooves 28 when neither the rotor nor the stator windings are in place. This scenario arises for a new core that is being assembled and for a core that is undergoing a rewind operation after the old windings have been removed to better assess the condition of the core. As described elsewhere herein, as a reversing polarity and a reducing amplitude voltage are supplied to the conductor 38, the current is reversed and reduced in amplitude and the corresponding magnetic field is reversed and reduced in intensity. A combination of the reversing magnetic field and the reduced field intensity demagnetizes the stator core 20. The demagnetization process can also be performed with the rotor core in place. For this application the conductor 38 is disposed within the air gap between the stator and rotor.

Figure 2:
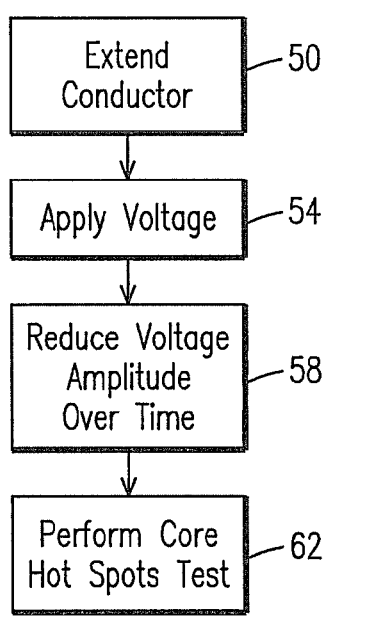
FIG. 2 is a flowchart depicting steps associated with an embodiment of the invention.

FIG. 2 is a flowchart illustrating steps associated with the present invention. At a step 50 one or more conductors are extended through or proximate a stator core. A voltage is applied to the one or more conductors at a step 54. As described elsewhere herein, the voltage comprises a polarity-reversing voltage and the corresponding current can produce a flux level of up to about 33% of an operating flux density.

At a step 58 the voltage is reduced incrementally until a minimum desired voltage is reached. This voltage reduction reduces the current magnitude, which in turn reduces an intensity of the magnetic field. After core demagnetization has been completed, at a step 62 the EL-CID or another core imperfection test is performed.

The inventors have shown through conducting tests that a core demagnetized as described herein is more likely to produce a flat line result during a hot spot test in which no hot spots are detected. That is, if there are no core hot spots due to core short circuits the test results depict a nominally flat line as described above, the residual magnetic field having been removed. If the described demagnetization process is conducted after conducting a loop test and prior to conducting an EL-CID test, then any detected anomalies are the result of shorted core laminations, rather than due to residual magnetism.

The inventors have also shown that a trace plot for a core segment scanned before demagnetization shows banding and a reduced-amplitude response of a signal indicating a known core short. The trace plot after demagnetization shows a flatter trace (no banding) and an increased amplitude response from the known short.

As known by those skilled in the art, there are other techniques that can be employed to reduce or eliminate the residual magnetic fields of a generator core. A yoke (i.e., a solenoidal coil) energized by a single phase AC voltage generates a magnetic field. The coil can be positioned proximate the core and pulled away from the core (or alternatively through the core) to demagnetize the core.

The core can also be heated to its Curie temperature (about 1440 degrees F. for steel) to fully demagnetize the core. Heating to temperatures below the Curie temperature partially demagnetizes the core. Given the size and mass of the core, these processes are difficult to implement.

One embodiment of the invention provides about a 30% improvement in the signal-to-noise ratio of the EL-CID output signal, even when the EL-CID test is performed after a loop test. This improvement provides more sensitive and accurate EL-CID test results, reduces the time required to interpret the test results and allows more accurate trend analysis when comparing current test results with previous EL-CID test results or with the baseline results for the stator core.

While various embodiments of the present invention have been shown and described herein, it will be obvious that such embodiments are provided by way of example only. Numerous variations, changes and substitutions may be made without departing from the invention herein. Accordingly, it is intended that the invention be limited only by the spirit and scope of the appended claims.

The invention claimed is:

1. A method comprising:
   extending one or more conductors through or proximate a generator stator core;
   applying a polarity-reversing excitation voltage to the one or more conductors; and
   reducing an amplitude of the voltage over time, wherein the voltage causes current to flow in the one or more conductors, the current generating a magnetic field that demagnetizes the stator core.

2. The method of claim 1 wherein the excitation voltage comprises an AC voltage or a pulsating DC voltage.

3. The method of claim 2 wherein the pulsating DC voltage comprises DC voltage having a polarity-reversing frequency of between about 0.0001 and 12 Hz.

4. The method of claim 2 wherein the DC voltage is reduced in increments to reduce the current in increments of between about 200 and 500 amperes.

5. The method of claim 1 wherein the excitation voltage comprises an AC voltage and the step of applying the excitation voltage has a duration of about ten seconds.

6. The method of claim 1 wherein the current flowing through the one or more conductors comprises a current of between about 500 and 20,000 A.

7. The method of claim 1 wherein the step of extending comprises one of extending the one or more conductors through a bore in the stator core and extending the one or more conductors through an air gap defined between the stator core and a generator rotor.

8. The method of claim 7 wherein the step of extending the one or more conductors through the bore comprises extending the one or more conductors through a slot defined between first and second adjacent stator teeth.

9. The method of claim 1 wherein after executing the extending, applying and reducing steps associated with demagnetizing the stator core, the method further comprises a step of detecting hot spots in the stator core, wherein a first signal generated by a detector indicating core hot spots exhibits an improved signal-to-noise ratio over a second signal generated by the detector before executing the steps associated with demagnetizing the stator core.

10. The method of claim 1 wherein the current produces a flux level of up to about 33% of an operating flux density.

11. The method of claim 1 wherein the step of extending comprises extending the one or more conductors through or proximate the stator core at a first location followed by the steps of applying and reducing, and extending the one or more conductors through or proximate the stator core at a second location followed by the steps of applying and reducing.

12. The method of claim 11 wherein the one or more conductors comprise a plurality of conductors forming a loop.

13. An apparatus comprising:
one or more conductors configured for extending through a generator stator core;
a power supply for supplying a polarity-reversing voltage to the one or more conductors; and
wherein the power supply is controllable to reduce an amplitude of the voltage with time, wherein the voltage causes current to flow in the conductor, the current's magnetic induction acting to demagnetize the stator core.

14. The apparatus of claim 13 wherein the conductor comprises two loops of a 4/0 gage multi-strand conductor.

15. The apparatus of claim 13 wherein the power supply supplies an AC voltage or a pulsating DC voltage, the pulsating DC voltage having a frequency of between about 0.0001 and 12 Hz.

16. The apparatus of claim 13 wherein the power supply is an AC voltage power supply and the voltage is applied to the one or more conductors for about ten seconds.

17. The apparatus of claim 13 wherein the one or more conductors are extended through a stator bore or through an air gap between the stator and a generator rotor.

18. The apparatus of claim 13 wherein the one or more conductors comprise a plurality of conductors forming a loop.

19. A method comprising:
demagnetizing the stator core by:
extending one or more conductors through or proximate the stator core;
applying a polarity-reversing first voltage to the one or more conductors; and
reducing an amplitude of the first voltage over time, wherein the first voltage causes current to flow in the one or more conductors, the current generating a magnetic field that demagnetizes the core;
supplying a second voltage to an excitation current loop; and
passing a detector coil proximate an inner surface of the stator core to determine a magnetic flux produced in the stator core by the second voltage and to detect where the magnetic flux is influenced by hot spots in the stator core.

20. The method of claim 19 wherein a reduced level of residual magnetism in the stator core, resulting from the step of demagnetizing the stator core, reduces a current in the excitation current loop and improves a signal-to-noise ratio of a signal representing the magnetic flux.

21. A method comprising:
calculating an expected value of current to flow in an excitation loop to generate a predetermined magnetic flux in a stator core;
applying a first voltage to the excitation loop to cause the expected value of current to flow in the excitation loop;
measuring an actual value of current flowing in the excitation loop;
comparing the expected value of current and the actual value of current; and
determining the presence of residual magnetic flux in the stator core from the step of comparing when the actual value of current is greater than the expected value of current.

* * * * *